United States Patent
Zarabadi

(10) Patent No.: US 12,484,203 B2
(45) Date of Patent: Nov. 25, 2025

(54) SYSTEMS AND METHODS FOR CONTROLLED ACTIVE DISCHARGE FOR INVERTER FOR ELECTRIC VEHICLE

(71) Applicant: BorgWarner US Technologies LLC, Wilmington, DE (US)

(72) Inventor: Seyed R. Zarabadi, Kokomo, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 429 days.

(21) Appl. No.: 18/297,738

(22) Filed: Apr. 10, 2023

(65) Prior Publication Data
US 2024/0106347 A1  Mar. 28, 2024

Related U.S. Application Data

(60) Provisional application No. 63/378,601, filed on Oct. 6, 2022, provisional application No. 63/377,486, filed on
(Continued)

(51) Int. Cl.
*H02M 7/5387* (2007.01)
*B60L 3/00* (2019.01)
(Continued)

(52) U.S. Cl.
CPC ............ *H02M 7/5387* (2013.01); *B60L 3/003* (2013.01); *B60L 15/007* (2013.01); *B60L 15/08* (2013.01);
(Continued)

(58) Field of Classification Search
CPC .......... B60L 53/20; B60L 53/22; B60L 50/40; B60L 50/51; B60L 50/60; H03K 2017/0806; H03K 17/082–0828
See application file for complete search history.

(56) References Cited

U.S. PATENT DOCUMENTS

| 4,054,828 A | 10/1977 | Conzelmann et al. |
| 4,128,801 A | 12/1978 | Gansert et al. |

(Continued)

FOREIGN PATENT DOCUMENTS

| WO | 2007093598 A1 | 8/2007 |
| WO | 2019034505 A1 | 2/2019 |

(Continued)

OTHER PUBLICATIONS

Balogh, L., "Fundamentals of MOSFET and IGBT Gate Driver Circuits," Texas Instruments Application Report, SLUA618-March (2017), Retrieved from internet URL: https://ghioni.faculty.polimi.it/pel/readmat/gate-drive.pdf, 65 pages.
(Continued)

*Primary Examiner* — Thienvu V Tran
*Assistant Examiner* — Christopher J Clark
(74) *Attorney, Agent, or Firm* — Joshua M. Haines; Bookoff McAndrews, PLLC

(57) ABSTRACT

A system includes: an inverter configured to convert DC power from a battery to AC power to drive a motor, wherein the inverter includes: a power switch including a drain terminal, a source terminal, and a gate terminal; and one or more controllers configured to: detect a temperature of the power switch, a rate of change in current of the power switch, and a filtered current of the power switch, and control a pulse width of a gate control signal to the gate terminal based on the detected temperature of the power switch, the detected rate of change in current of the power switch, and the detected filtered current of the power switch.

18 Claims, 9 Drawing Sheets

Related U.S. Application Data on Sep. 28, 2022, provisional application No. 63/377,512, filed on Sep. 28, 2022, provisional application No. 63/377,501, filed on Sep. 28, 2022.

(51) Int. Cl.

| | | |
|---|---|---|
| *B60L 15/00* | (2006.01) | |
| *B60L 15/08* | (2006.01) | |
| *B60L 50/40* | (2019.01) | |
| *B60L 50/51* | (2019.01) | |
| *B60L 50/60* | (2019.01) | |
| *B60L 50/64* | (2019.01) | |
| *B60L 53/20* | (2019.01) | |
| *B60L 53/22* | (2019.01) | |
| *B60L 53/62* | (2019.01) | |
| *B60R 16/02* | (2006.01) | |
| *H01L 21/48* | (2006.01) | |
| *H01L 23/00* | (2006.01) | |
| *H01L 23/15* | (2006.01) | |
| *H01L 23/367* | (2006.01) | |
| *H01L 23/373* | (2006.01) | |
| *H01L 23/40* | (2006.01) | |
| *H01L 23/467* | (2006.01) | |
| *H01L 23/495* | (2006.01) | |
| *H01L 23/538* | (2006.01) | |
| *H01L 25/00* | (2006.01) | |
| *H02M 1/00* | (2007.01) | |
| *H02M 1/08* | (2006.01) | |
| *H02M 1/084* | (2006.01) | |
| *H02M 1/088* | (2006.01) | |
| *H02M 1/12* | (2006.01) | |
| *H02M 1/32* | (2007.01) | |
| *H02M 1/42* | (2007.01) | |
| *H02M 1/44* | (2007.01) | |
| *H02M 3/335* | (2006.01) | |
| *H02M 7/00* | (2006.01) | |
| *H02M 7/537* | (2006.01) | |
| *H02M 7/5395* | (2006.01) | |
| *H02P 27/06* | (2006.01) | |
| *H02P 27/08* | (2006.01) | |
| *H02P 29/024* | (2016.01) | |
| *H02P 29/68* | (2016.01) | |
| *H05K 1/14* | (2006.01) | |
| *H05K 1/18* | (2006.01) | |
| *H05K 5/02* | (2006.01) | |
| *H05K 7/20* | (2006.01) | |
| *H10D 64/01* | (2025.01) | |
| *B60L 15/20* | (2006.01) | |
| *G01R 15/20* | (2006.01) | |
| *G06F 1/08* | (2006.01) | |
| *G06F 13/40* | (2006.01) | |
| *H01L 23/473* | (2006.01) | |
| *H01L 25/07* | (2006.01) | |
| *H02J 7/00* | (2006.01) | |
| *H03K 19/20* | (2006.01) | |

(52) U.S. Cl.
CPC .............. *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60R 16/02* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/49562* (2013.01); *H01L 23/5383* (2013.01); *H01L 24/32* (2013.01); *H01L 24/33* (2013.01); *H01L 25/50* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/182* (2013.01); *H05K 5/0247* (2013.01); *H05K 7/20154* (2013.01); *H05K 7/2039* (2013.01); *H05K 7/2049* (2013.01); *H05K 7/20854* (2013.01); *H05K 7/209* (2013.01); *H10D 64/018* (2025.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G01R 15/20* (2013.01); *G06F 1/08* (2013.01); *G06F 13/4004* (2013.01); *G06F 2213/40* (2013.01); *H01L 2023/405* (2013.01); *H01L 2023/4087* (2013.01); *H01L 23/473* (2013.01); *H01L 25/072* (2013.01); *H01L 2224/32225* (2013.01); *H01L 2224/32245* (2013.01); *H01L 2224/33181* (2013.01); *H02J 7/0063* (2013.01); *H02J 2207/20* (2020.01); *H02P 2207/05* (2013.01); *H03K 19/20* (2013.01); *H05K 1/181* (2013.01); *H05K 7/20927* (2013.01); *H05K 2201/042* (2013.01); *H05K 2201/10166* (2013.01)

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |
| 5,654,863 A | 8/1997 | Davies |
| 5,764,007 A | 6/1998 | Jones |
| 5,841,312 A | 11/1998 | Mindl et al. |
| 6,028,470 A | 2/2000 | Michel et al. |
| 6,163,138 A | 12/2000 | Kohl et al. |
| 6,351,173 B1 | 2/2002 | Ovens et al. |
| 6,426,857 B1 | 7/2002 | Doster et al. |
| 6,597,556 B1 | 7/2003 | Michel et al. |
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |
| 7,459,954 B2 | 12/2008 | Kuehner et al. |
| 7,538,425 B2 | 5/2009 | Myers et al. |
| 7,551,439 B2 | 6/2009 | Peugh et al. |
| 7,616,047 B2 | 11/2009 | Rees et al. |
| 7,724,046 B2 | 5/2010 | Wendt et al. |
| 7,750,720 B2 | 7/2010 | Dittrich |
| 9,088,159 B2 | 7/2015 | Peuser |
| 9,275,915 B2 | 3/2016 | Heinisch et al. |
| 9,373,970 B2 | 6/2016 | Feuerstack et al. |
| 9,431,932 B2 | 8/2016 | Schmidt et al. |

(56) References Cited

U.S. PATENT DOCUMENTS

| | | |
|---|---|---|
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,525,847 B2 | 1/2020 | Strobel et al. |
| 10,797,579 B2 | 10/2020 | Hashim et al. |
| 10,924,001 B2 | 2/2021 | Li et al. |
| 10,965,120 B2 * | 3/2021 | Illing ................. H02H 3/093 |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2012/0235488 A1 | 9/2012 | Hamanaka et al. |
| 2017/0126145 A1* | 5/2017 | Schulz ................. H03K 17/0828 |
| 2017/0331469 A1 | 11/2017 | Kilb et al. |
| 2017/0338646 A1* | 11/2017 | Djelassi ................. H02H 3/04 |
| 2018/0219546 A1* | 8/2018 | Yang ................. B60L 15/02 |
| 2020/0195121 A1 | 6/2020 | Keskar et al. |
| 2021/0005711 A1 | 1/2021 | Martinez-Limia et al. |
| 2021/0044288 A1 | 2/2021 | Troyer et al. |
| 2021/0257903 A1* | 8/2021 | Edelhäuser ................. H02M 1/32 |
| 2022/0052610 A1 | 2/2022 | Plum |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0014813 A1* | 1/2024 | Kumazawa ................. H02M 1/44 |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088703 A1* | 3/2024 | Wang ................. B60L 3/0046 |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |

(56) References Cited

U.S. PATENT DOCUMENTS

| | | |
|---|---|---|
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | |
|---|---|---|
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

* cited by examiner

SYSTEMS AND METHODS FOR CONTROLLED ACTIVE DISCHARGE FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to systems and methods for a controlled active discharge for an inverter for an electric vehicle, and, more particularly, to systems and methods for a configurable active discharge that is controlled based on one or more of current or temperature.

BACKGROUND

Inverters, such as those used to drive a motor in an electric vehicle, for example, are responsible for converting High Voltage Direct Current (HVDC) into Alternating Current (AC) to drive the motor. In an inverter, a bulk capacitor is discharged in the event of a fault condition to reduce the risk of contact with high voltages. Active discharge of the bulk capacitor may stress power switches.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a power switch including a drain terminal, a source terminal, and a gate terminal; and one or more controllers configured to: detect a temperature of the power switch, a rate of change in current of the power switch, and a filtered current of the power switch, and control a pulse width of a gate control signal to the gate terminal based on the detected temperature of the power switch, the detected rate of change in current of the power switch, and the detected filtered current of the power switch.

In some aspects, the techniques described herein relate to a system, wherein the one or more controllers is further configured to perform an N average determination, wherein the N average determination includes: applying N pulses with a first pulse width and a period to the power switch, storing, during each period of the applied N pulses, the detected temperature of the power switch, the detected rate of change in current of the power switch, and the detected filtered current of the power switch, and determining an average of the N stored temperatures, an average of the N stored rates of change in current, and an average of the N stored filtered currents.

In some aspects, the techniques described herein relate to a system, wherein the one or more controllers are further configured to perform an N threshold determination, wherein the N threshold determination includes: determining whether the average of the N stored temperatures is greater than a threshold temperature, whether the average of the N stored rates of change in current is greater than a threshold rates of change in current, and whether the average of the N stored filtered currents is greater than a threshold filtered current, and controlling the pulse width of the gate control signal to the gate terminal based on the determining of the N threshold determination.

In some aspects, the techniques described herein relate to a system, wherein the one or more controllers are further configured to perform an M average determination, wherein the M average determination includes: repeating the N average determination and the N threshold determination for M cycles, storing the average of the N stored temperatures, the average of the N stored rates of change in current, and the average of the N stored filtered currents for each cycle of the M cycles, and determining an average of the M stored temperatures, an average of the M stored rates of change in current, and an average of the M stored filtered currents.

In some aspects, the techniques described herein relate to a system, wherein the one or more controllers are further configured to perform an M threshold determination, wherein the M threshold determination includes: determining whether the average of the M stored temperatures is greater than the threshold temperature, whether the average of the M stored rates of change in current is greater than the threshold rates of change in current, and whether the average of the M stored filtered currents is greater than the threshold filtered current, and controlling the pulse width of the gate control signal to the gate terminal based on the determining of the M threshold determination.

In some aspects, the techniques described herein relate to a system, wherein the one or more controllers are further configured to: determine a voltage value of a bulk capacitor of the inverter, and repeat the M average determination and the M threshold determination while the determined voltage value is greater than a threshold discharge voltage value.

In some aspects, the techniques described herein relate to a system, wherein the controlling the pulse width of the gate control signal to the gate terminal based on the determining of the N threshold determination does not include increasing the pulse width.

In some aspects, the techniques described herein relate to a system, wherein the one or more controllers are one or more point-of-use controllers on a power module with the power switch.

In some aspects, the techniques described herein relate to a system, wherein the source terminal of the power switch is configured to be connected to a negative terminal of the battery, and the drain terminal of the power switch is configured to be connected to a phase terminal of the motor.

In some aspects, the techniques described herein relate to a system, further including: the battery configured to supply the DC power to the inverter; and the motor configured to receive the AC power from the inverter to drive the motor.

In some aspects, the techniques described herein relate to a method including: detecting a temperature of a power switch, a rate of change in current of the power switch, and a filtered current of the power switch, and controlling a pulse width of a gate control signal to a gate terminal of the power switch based on the detected temperature of the power switch, the detected rate of change in current of the power switch, and the detected filtered current of the power switch.

In some aspects, the techniques described herein relate to a method, further including: performing an N average determination, wherein the N average determination includes: applying N pulses with a first pulse width and a period to the power switch, storing, during each period of the applied N pulses, the detected temperature of the power switch, the detected rate of change in current of the power switch, and the detected filtered current of the power switch, and determining an average of the N stored temperatures, an average of the N stored rates of change in current, and an average of the N stored filtered currents.

In some aspects, the techniques described herein relate to a method, further including: performing an N threshold determination, wherein the N threshold determination includes: determining whether the average of the N stored temperatures is greater than a threshold temperature, whether the average of the N stored rates of change in current is greater than a threshold rates of change in current, and whether the average of the N stored filtered currents is greater than a threshold filtered current, and controlling the pulse width of the gate control signal to the gate terminal based on the determining of the N threshold determination.

In some aspects, the techniques described herein relate to a method, further including: performing an M average determination, wherein the M average determination includes: repeating the N average determination and the N threshold determination for M cycles, storing the average of the N stored temperatures, the average of the N stored rates of change in current, and the average of the N stored filtered currents for each cycle of the M cycles, and determining an average of the M stored temperatures, an average of the M stored rates of change in current, and an average of the M stored filtered currents.

In some aspects, the techniques described herein relate to a method, further including: performing an M threshold determination, wherein the M threshold determination includes: determining whether the average of the M stored temperatures is greater than the threshold temperature, whether the average of the M stored rates of change in current is greater than the threshold rates of change in current, and whether the average of the M stored filtered currents is greater than the threshold filtered current, and controlling the pulse width of the gate control signal to the gate terminal based on the determining of the M threshold determination.

In some aspects, the techniques described herein relate to a method, further including: determining a voltage value of a bulk capacitor associated with the power switch, and repeating the M average determination and the M threshold determination while the determined voltage value is greater than a threshold discharge voltage value.

In some aspects, the techniques described herein relate to a method, wherein the controlling the pulse width of the gate control signal to the gate terminal based on the determining of the N threshold determination does not include increasing the pulse width.

In some aspects, the techniques described herein relate to a system including: a power module for an inverter for an electric vehicle, the power module including: a power switch including a drain terminal, a source terminal, and a gate terminal; and one or more controllers configured to: detect a temperature of the power switch, a rate of change in current of the power switch, and a filtered current of the power switch, and control a pulse width of a gate control signal to the gate terminal based on the detected temperature of the power switch, the detected rate of change in current of the power switch, and the detected filtered current of the power switch.

In some aspects, the techniques described herein relate to a system, wherein the one or more controllers are configured to control the pulse width of a gate control signal to the gate terminal by increasing or decreasing the pulse width.

In some aspects, the techniques described herein relate to a system, wherein the one or more controllers are configured to perform an operation to decrease the pulse width more frequently than to perform an operation to increase the pulse width.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
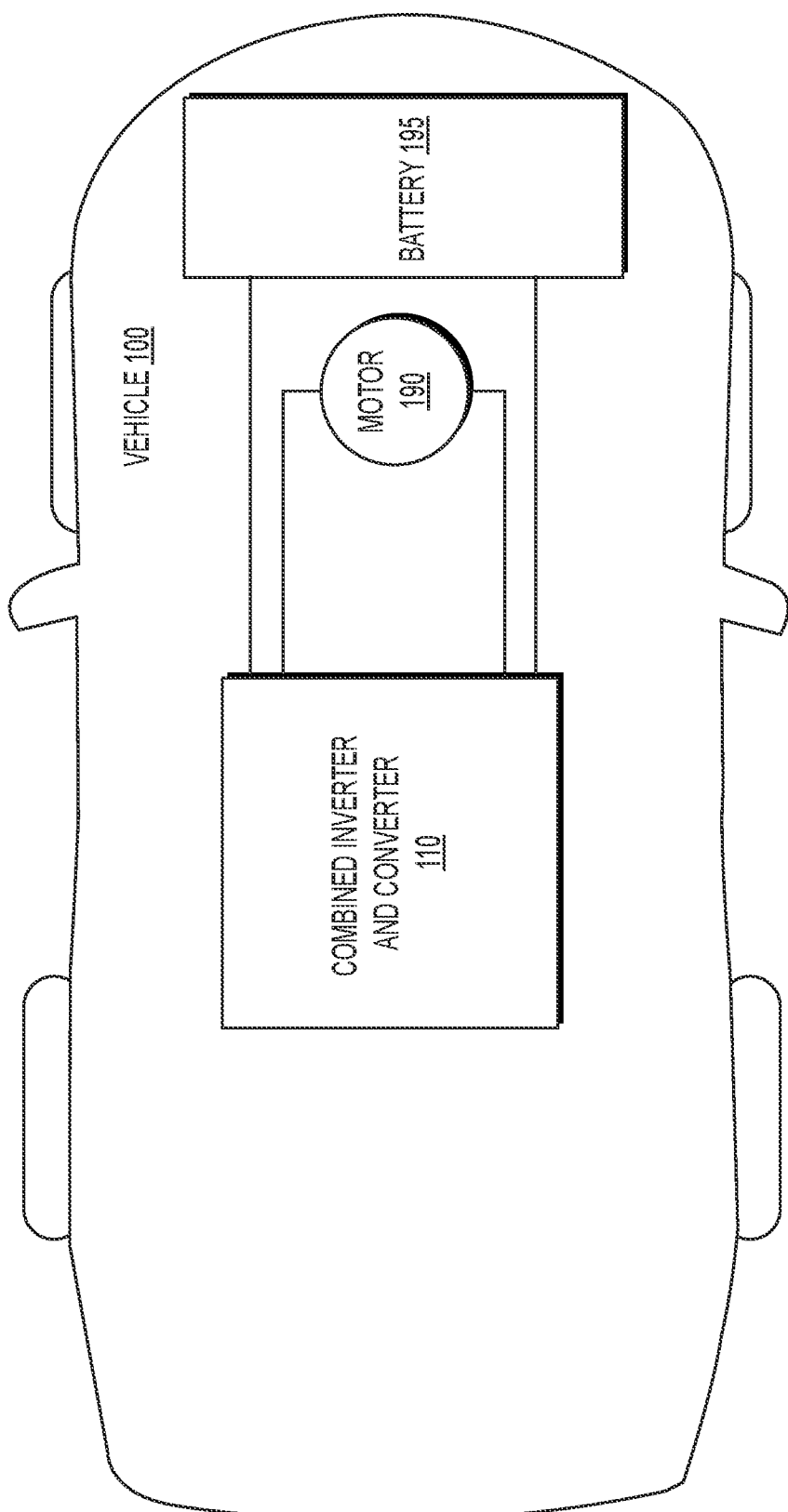
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems and methods for a controlled active discharge for an inverter for an electric vehicle, and, more particularly, to systems and methods for a configurable active discharge that is controlled based on one or more of current or temperature.

Inverters, such as those used to drive a motor in an electric vehicle, for example, are responsible for converting High Voltage Direct Current (HVDC) into Alternating Current (AC) to drive the motor. A three-phase inverter may include a bridge with six power device switches (for example, power transistors such as IGBT or MOSFET) that are controlled by Pulse Width Modulation (PWM) signals generated by a controller. An inverter may include three phase switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the phase switches. The phase switches may drive the phase voltage.

A FET driver circuit may use a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100 V, for example.

As a result of system design, a significant amount of energy may be stored on the high voltage bus bulk/DC link capacitor of the inverter. This stored high voltage energy must be dissipated to prevent human exposure to dangerous voltage levels. A function of inverters called "active discharge" allows for the controlled dissipation of the stored energy in the system capacitance. A high voltage battery providing energy to the inverter is disconnected prior to initiating active discharge of the bus to avoid discharging the battery. The active discharge function has the ability to quickly dissipate high voltage bus energy for safety in events such as vehicle service, vehicle crash, and the like. The rate of discharge is a function of initial bus voltage, capacitance, and the energy dissipation mechanism. Government/OEM regulations also dictate what discharge rates are required.

Inverters frequently have a safety requirement to discharge the bulk capacitor on the inverter, in the event of a crash or other fault situation, in a short period of time, such as between 1 and 3 seconds, for example. Some systems discharge the bulk capacitor using the motor windings, which requires the motor to not be shorted and for the main microcontroller to be available. Some systems discharge the bulk capacitor using a dedicated resistive discharge, which is frequently a combination of a high power resistor, a switch, and a controller.

Accordingly, an inverter may use switching losses in the inverter power device switches (IGBT/FET) to discharge energy. Controlling the power devices on/off (also referred to as enabling/disabling) creates losses that can be predicted. Switching numerous times at a high frequency rate will contribute to a significant amount of these accumulated losses. A rate of the discharge (losses) may be proportional to the switching frequency. These losses can be used to discharge the HVDC bus quickly, without the added cost and complexity of using the motor windings or a dedicated resistive discharge. Additionally, by eliminating the resistive element from traditional approaches, substantial cost, circuit board area, and unwanted heat can be saved.

Some systems discharge the bulk capacitor using gate drivers to operate one power switch in the half-H bridge switches in a linear mode, which effectively uses the power switch as a resistor by controlling the gate positive bias voltage and/or switching. In this method, one power switch (e.g. upper switch) is turned ON as in a normal operation, and the other power switch (e.g. lower switch) is pulsed ON with a reduced gate voltage. The HVDC bus and bulk capacitor may be discharged via specific PWM pulses. During active discharge, the power switch may experience an increase in temperature that is significant enough to produce failure if the temperature is not controlled.

A power switch may have a significant difference in a transfer characteristic based on temperature, especially in a linear mode region targeted by the DC-Link discharge. Temperature differences may be based on environmental temperatures, and may include temperatures such as −40 C to 100 C operating temperatures, for example.

Some systems discharge the bulk capacitor using threshold detection, which requires an opposite device to be off, may have an option to increase a sensed threshold by one step (e.g. 390 mV), and may have a voltage that is fixed at a start of the discharge operation and not variable during the discharge operation. Some systems discharge the bulk capacitor using a pre-programmed voltage, where the voltage is fixed at power-up during a configuration mode, and cannot be changed during an operation of the inverter.

A point-of-use controller may be on a power module including a phase switch. The temperature of the phase switch and/or power module may be an important factor in the control of the inverter. A phase switch may include one or more silicon carbide (SiC) dies, for example. One or more embodiments may include a thermistor to monitor the SiC die temperature. One or more embodiments may include a point-of use controller, such as an integrated gate driver ASIC, for example. The ASIC may precisely measure a temperature using on-chip integrated trimmed thermal sensors. SiC gate threshold voltage and transconductance both decrease with temperature.

Compared to Si IGBT, SiC MOSFET has more stringent overcurrent circuit protection requirements. Compared to IGBT, which may have similar blocking voltage and current rating, SiC MOSFETs have a smaller chip area, which may make a parasitic capacitance smaller than IGBT, which may increase the intrinsic switching speed. However, the smaller chip area of the SiC MOSFET die may also provide a lower thermal dissipation capability than IGBT. During an overcurrent condition, the fast-growing current may generate a significant amount of joule heating and the SiC MOSFET die may be destroyed in a short period of time if enough capability to dissipate the heat is not met. With a smaller die size, the surge current capability of SiC MOSFET may be significantly lower than that the IGBT counterpart.

One or more embodiments may allow for temperature-based control of the power module during a bulk capacitance discharge. Bulk capacitor discharge at turn off is a function where the bulk capacitor is discharged quickly after the battery contactors are opened. This bulk capacitance discharge reduces the risk of contact with high voltages. Bulk capacitor discharge may transfer energy from the bulk capacitor (e.g. 700 μF*800 V$^2$) to the power switches, and should be accomplished in a controlled manner. Using the temperature of the SiC devices during bulk capacitance discharge may reduce a discharge time while protecting the SiC devices from excessive temperature rise.

One or more embodiments may provide an integrated gate driver located inside a power module. The integrated gate driver may be an ASIC. The ASIC may include two thermal sensors on the ASIC. The thermal sensors may be constructed of a stack of diodes having a voltage drop with a negative temperature coefficient. However, the disclosure is not limited thereto, and may include other ways to construct thermal sensors within an ASIC.

One or more embodiments may provide an active discharge operation that continuously measures values of a temperature, a change in current, and an average current, compares these measured values to threshold values, and periodically adjusts a pulse width of a PWM signal. One or more embodiments may provide a reduced time to discharge a bulk capacitor below a threshold voltage while maintaining a safe operation of the inverter.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
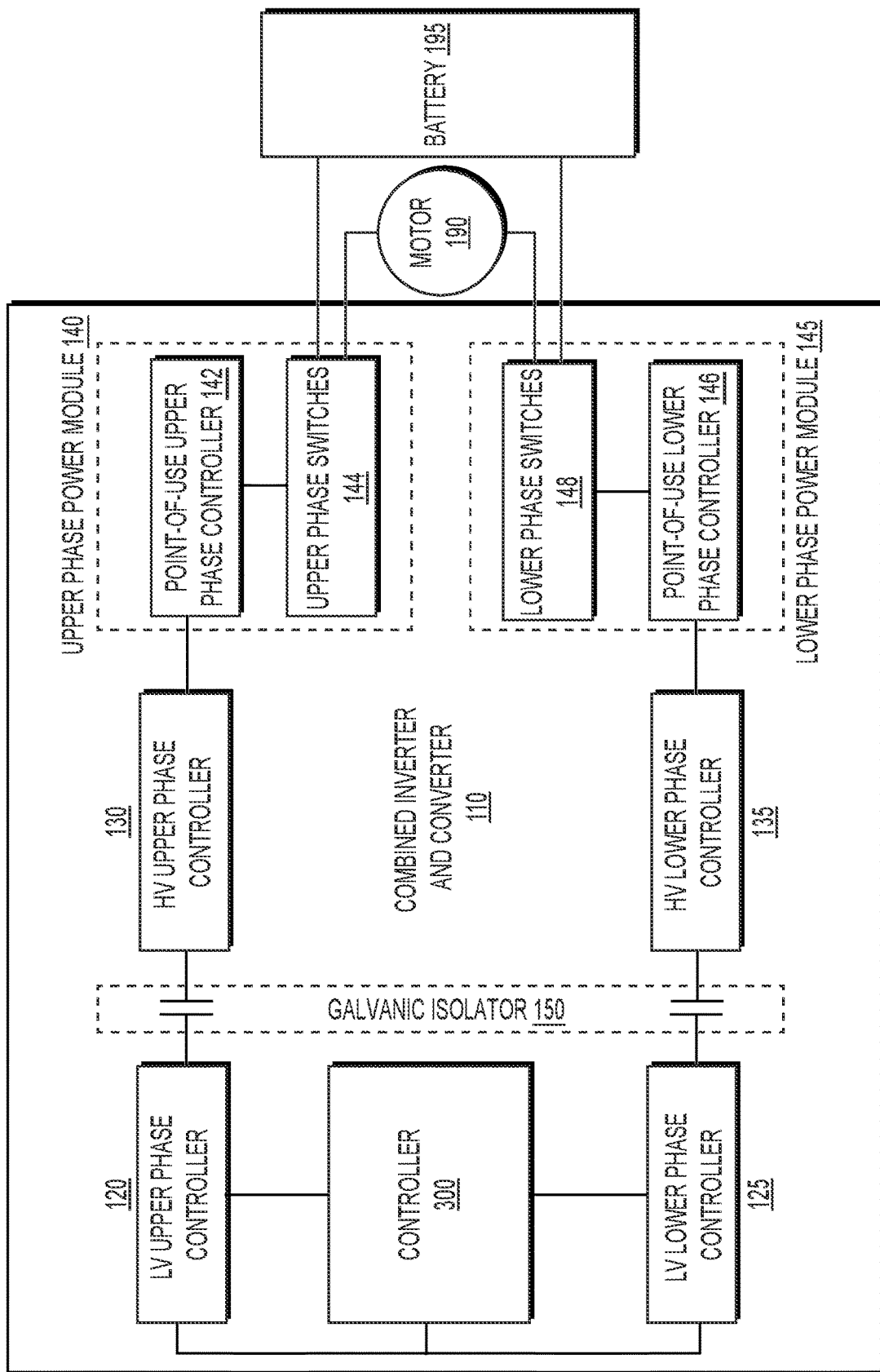
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries a complementary (180 degree out-of-phase) data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
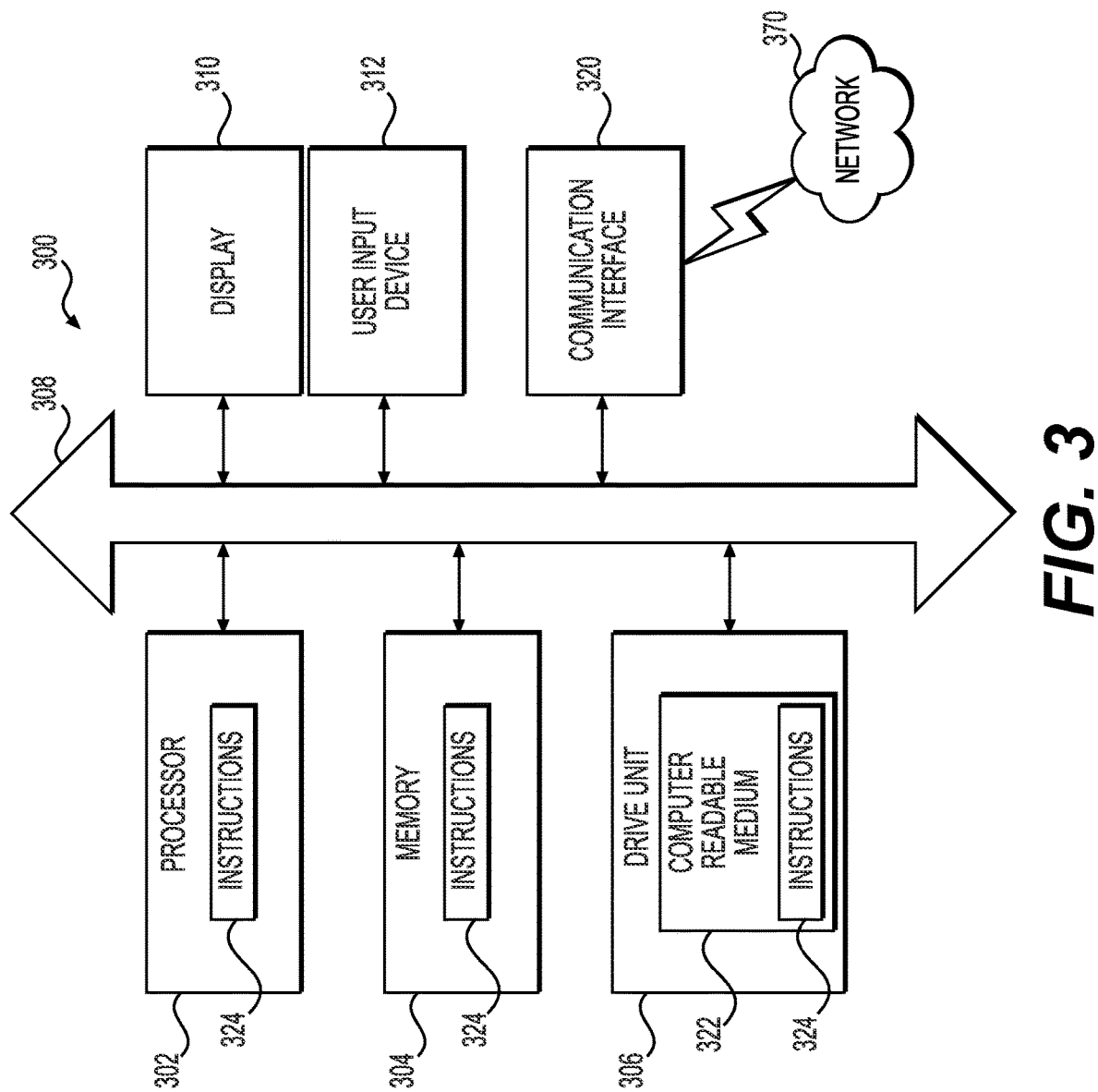
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
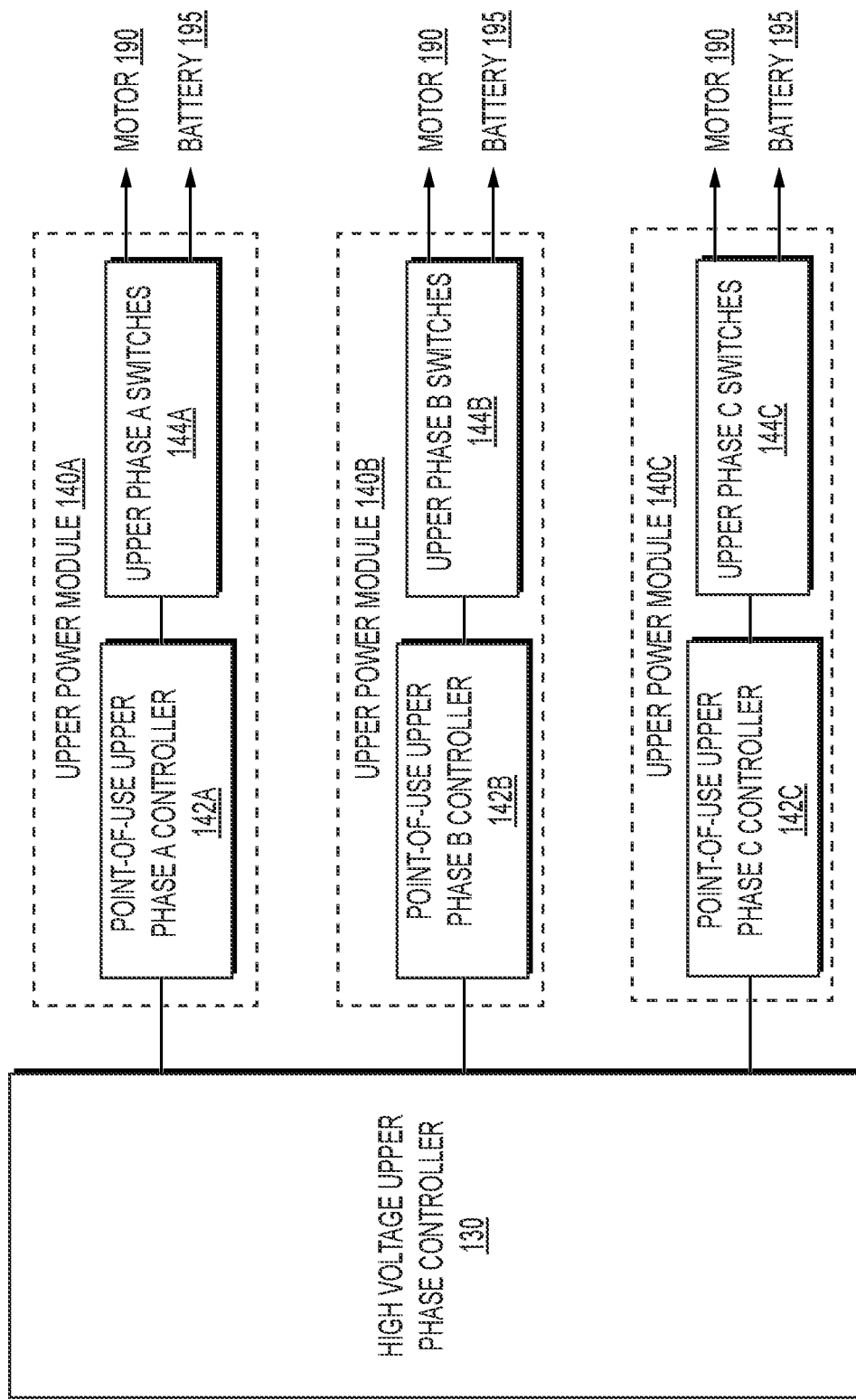
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
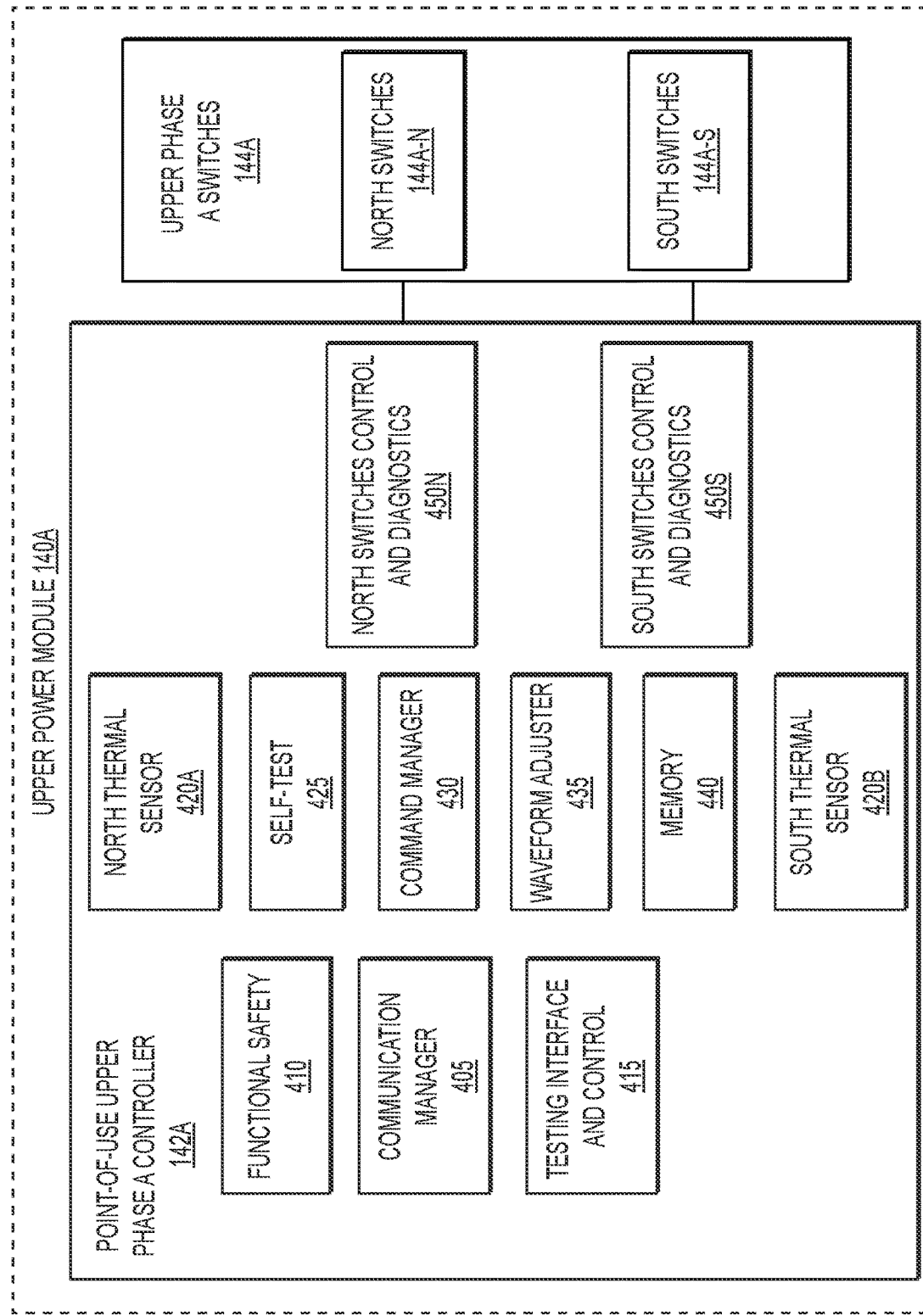
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and nonvolatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
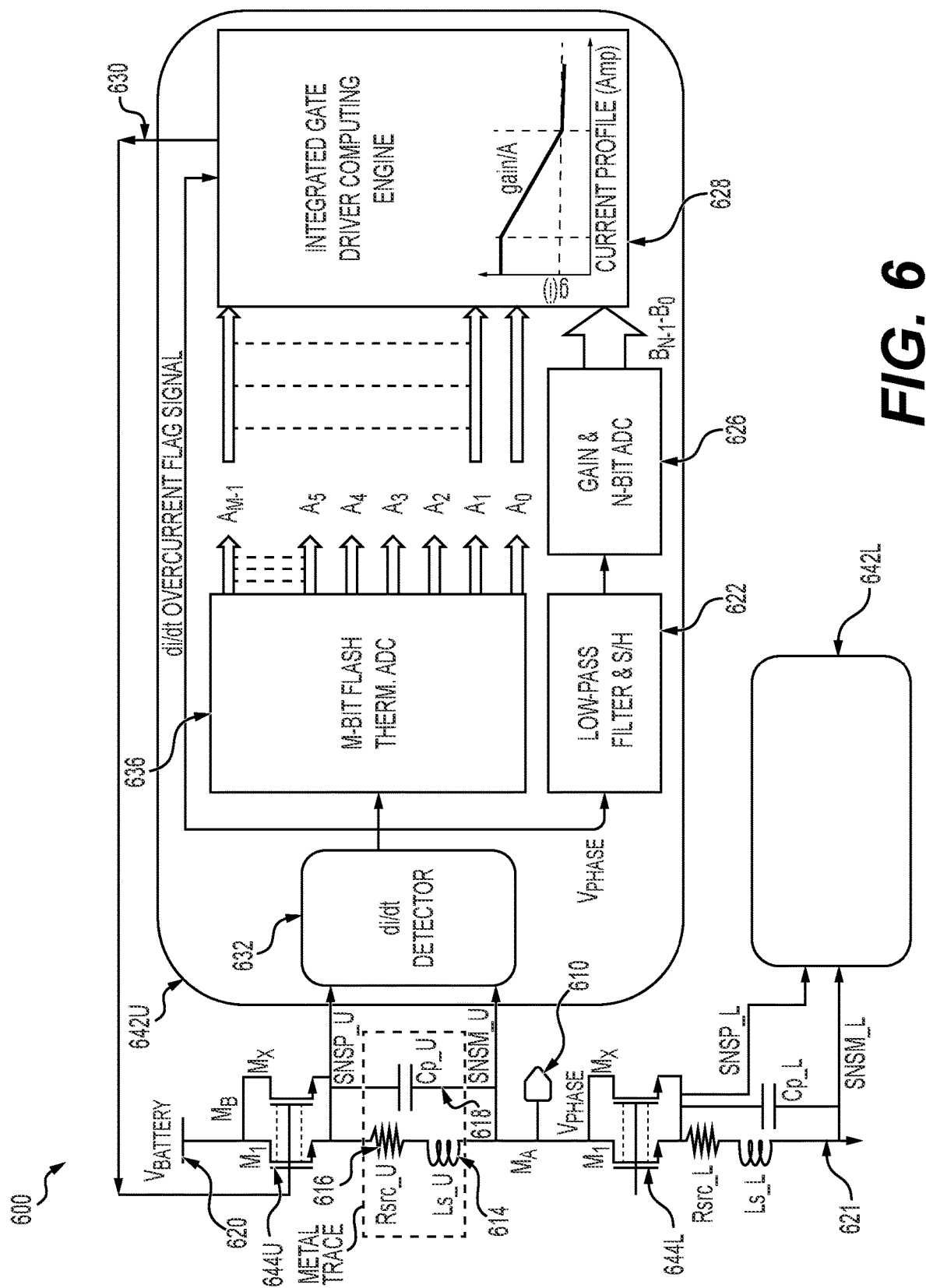
FIG. 6 depicts an exemplary system for detecting current of a power device switch, according to one or more embodiments.

FIG. 6 depicts an exemplary system for detecting current of a power device switch, according to one or more embodiments. Current detection system 600 may be an implementation of upper phase power module 140 and lower phase power module 145, for example. As shown in FIG. 6, upper power switches 644U (MB) may be an implementation of upper phase A switches 144A, and lower power switches 644L (MA) may be an implementation of lower phase A switches that pair with upper phase A switches 144A. As shown in FIG. 6, point-of-use upper phase controller 642U may be an implementation of point-of-use upper phase A controller 142A, for example, with a corresponding point-of-use lower phase A controller 642L. Even more specifically, point-of-use upper phase controller 642U may be an implementation of north switches control and diagnostics controller 450N and south switches control and diagnostics controller 450S, for example.

As shown in FIG. 6, current detection system 600 may include positive battery connection 620 and negative battery connection 621, which may be respective connections from battery 195, for example. Positive battery connection 620 may be connected to drain terminals of upper power switches 644U, the source terminals of upper power switches 644U may be connected to the drain terminals of lower power switches 644L, and the source terminals of lower power switches 644L may be connected to negative battery connection 621. Upper power switches 644U and lower power switches 644L may control a flow of energy from positive battery connection 620 and negative battery connection 621 to phase connection 610, which may be connected to motor 190, for example, to control a rotation of motor 190.

Metal tracing from the source terminals of the upper power switches 644U may provide, using bumps, for example, a first sensing input SNSP_U and a second sensing input SNSM_U to point-of-use upper phase controller 642U, and point-of-use upper phase controller 642U may provide a gate control signal 630 to the gate terminals of upper power switches 644U. A distance between first sensing input SNSP_U and second sensing input SNSM_U may be less than 30 cm, or may be less than 3 cm, for example. Point-of-use upper phase controller 642U may include current change rate detector 632, M-bit flash thermometer analog-to-digital converter 636, low-pass analog filter and sample-and-hold circuit 622, programmable gain controller and N-bit analog-to-digital converter 626, and Integrated Gate Driver Computing Engine (IGDCE) 628.

The current change rate detector 632 may receive signals from first sensing input SNSP_U and second sensing input SNSM_U, and provide signals to M-bit flash thermometer analog-to-digital converter 636, low-pass analog filter and sample-and-hold circuit 622, and IGDCE 628. M-bit flash thermometer analog-to-digital converter 636 may provide signals to IGDCE 628. Low-pass analog filter and sample-and-hold circuit 622 may provide signals to programmable gain controller and N-bit analog-to-digital converter 626, and programmable gain controller and N-bit analog-to-digital converter 626 may provide signals to IGDCE 628. The signal from the current change rate detector 632 directly to IGDCE 628 may indicate an overcurrent condition immediately to the IGDCE 628. The M-bit flash thermometer analog-to-digital converter 636 may provide signals in a relatively short duration time window to IGDCE 628 of the current. The low-pass analog filter and sample-and-hold circuit 622 and programmable gain controller and N-bit analog-to-digital converter 626 may provide a relatively long duration time window for IGDCE 628 of the current. With the instantaneous, short duration, and long duration current information, the IGDCE 628 may provide an improved response relative to systems that do not provide control based on this information.

One or more embodiments may provide a current detection system 600 that uses the metal trace in the source terminals of power FETs as a current sensing complex impedance. For lower power switches 644L, this trace impedance may be between the source terminals of lower power switches 644L and negative battery connection 621. For upper power switches 644U, this trace impedance may be between the source terminals of upper power switches 644U and phase connection 610, or between the source terminals of upper power switches 644U and the drain terminals of lower power switches 644L. For the upper power switches 644U, for example, the effective complex impedance of this metal trace may include an inductive component 614 in series with a resistive component 616 and along with a parallel shunting distributed/displacement capacitive component 618. Although shown as electrical devices in FIG. 6, the inductive component 614, resistive component 616, and capacitive component 618 are not additional devices, but are electrical properties of the metal trace itself. The effective complex impedance may be defined as $Z(s)=(Rsrc+SLs)\|(1/SCp)$, where Rsrc is the resistance of the resistive component 616, $S=j\omega$, where $\omega$ is the rad/sec frequency, Ls is the inductance of inductive component 614, and Cp is the capacitance of the capacitive component 618. During an overcurrent event, the series inductive component 614 may provide a large voltage term (e.g. voltage difference between SNSP_U and SNSM_U) that is proportional to the time rate of the flowing current in the source trace inductance itself. The metal trace of the source terminals of lower power switches 644L may have a similar inductive/resistive/capacitive structure.

In an event of turn on of the upper power switches 644U to a hard fault, such as when the drain of the lower power switches 644L is shorted to the negative battery connection 621, for example, the rate of change of the drain current may become large, which may cause the voltage across the inductive component 614 and resistive component 616 to increase according to $Vsrc\_metal\_trace=i_{ds}*Rsrc+Ls*di_{ds}/dt$. This may allow a hard short to be sensed and acted upon in a time duration of a few hundreds of nanoseconds to comfortably meet a short-circuit withstand time of less than 1.5 μs as required by fast power FETs. The inductive component 614 and resistive component 616 may be used to generate a voltage signal that is a shaped version of the drain current as if the current were flowing only in the resistive component 616. The shaped version of the drain current may be generated using low-pass analog filter and sample-and-hold circuit 622 with an output provided to programmable gain controller and N-bit analog-to-digital converter 626. This presents a sensing soft short or fault signal for the current detection system 600 to appropriately act upon the fault within the time duration of 1.0 μs or more, which may be configurable based on particular system requirements. The shaped current component may be used by IGDCE 628 to determine an optimum next cycle gate-drive PWM drive profile to help minimize the switching losses of the upper power switches 644U, while enabling the reduction of the PWM time duration, along with a reduction of minimum dead-time between lower power switches 644L and upper power switches 644U. This optimum next cycle gate-drive PWM drive profile may be provided as a gate control signal 630 to upper power switches 644U.

Upon the occurrence of a hard short, the IGDCE 628 may instantly receive a current change rate overcurrent signal from current change rate detector 632, and may immediately initiate shutting off the upper power switches 644U using a uniquely computed, or pre-determined, turn-off gate-drive profile to assure a safe turn-off of the faulted upper power switches 644U. M-bit flash thermometer analog-to-digital converter 636 is a fast responding circuit that may provide M logic signals to the IGDCE 628 to further assist in taking the most suitable decision in the case of hard and soft over-current event. IGDCE 628 may determine the most suitable decision to be the determination of a safest turn off profile, using a predetermined turn-off profile, or no immediate turn-off action while monitoring of the current amplitude trajectory, for example.

In the event of the occurrence of a soft short, the IGDCE may continuously receive a digital code from the programmable gain controller and N-bit analog-to-digital converter 626, where the digital code represents the shaped version of the drain current amplitude flowing for the faulted upper power switches 644U, which may enable a mostly noise-free signal of the current flowing in faulted upper power switches 644U. An accurate and noise-free device current signal may enable protection of the upper power switches 644U while maintaining a safe functionality of the current detection system 600. When a soft short begins to cause an unsafe system operating condition, the IGDCE 628 may immediately initiate a shutting down process of the faulted upper power switches 644U using a computed turn-off gate-drive profile to assure a safe and proper turn-off process. One or more embodiments may provide current detection for power devices that uses both the time rate of the change and the shaped version of the power FET current.

Figure 7:
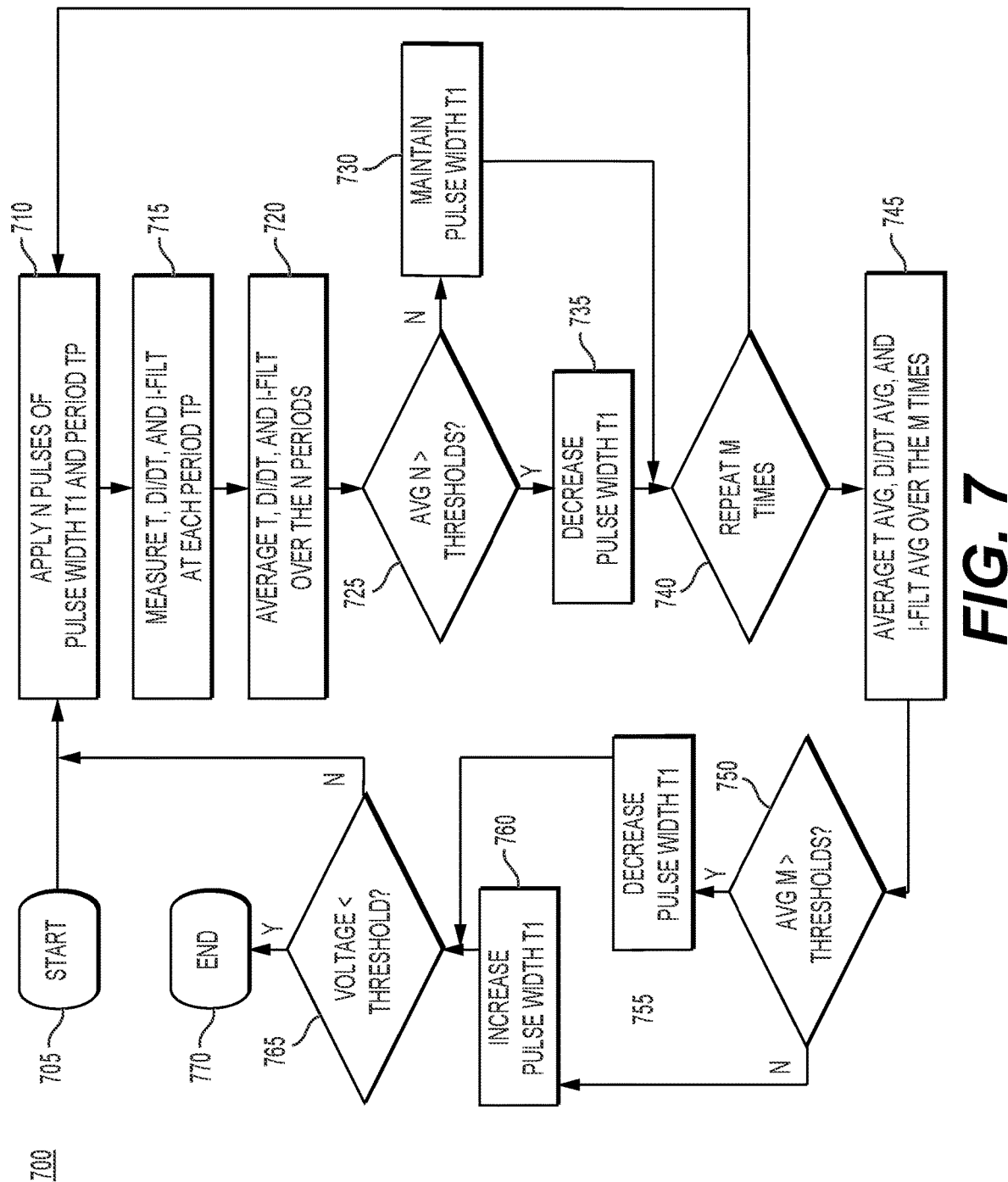
FIG. 7 depicts an exemplary method for controlling an active discharge operation, according to one or more embodiments.

FIG. 7 depicts an exemplary method 700 for controlling an active discharge operation, according to one or more embodiments. Method 700 may begin at start 705, and may include applying, by one or more controllers, such as point-of-use upper phase controller 642U, N (e.g. 32) pulses to a power switch, such as one or more of upper power switches 644U (operation 710). Each of the N pulses may have a configurable pulse width T1, such as 140 ns, for example. The N pulses may be applied with a constant period TP, such as 20 μs, for example.

During each period TP, the one or more controllers may measure a temperature (e.g. using north thermal sensor 420A and south thermal sensor 420B), a rate of change of current, di/dt, (e.g. using current change rate detector 632), and a filtered current (e.g. using low-pass analog filter and sample-and-hold circuit 622) of the power switch (operation 715). The measured temperature, di/dt, and filtered current may be stored in a memory of the one or more controllers. After N pulses, the one or more controllers may determine an average of the N stored temperatures, an average of the N stored di/dt's, and an average of the N stored filtered currents (operation 720).

The one or more controllers may determine whether the average of the N stored temperatures is greater than a threshold temperature, whether the average of the N stored di/dt's is greater than a threshold di/dt, and whether the average of the N stored filtered currents is greater than a threshold filtered current (operation 725). If all of the average values are less than the corresponding thresholds, the one or more controllers may maintain a pulse width T1 (operation 730). For example, the one or more controllers may maintain the pulse width T1 at 140 ns. However, if any of the average values is greater than a corresponding threshold, which may indicate that a temperature or current is too high, the one or more controllers may decrease pulse width T1 (operation 735). For example, the one or more controllers may decrease the pulse width T1 from 140 ns to 130 ns.

Here, the short-term (N) average values may be used to quickly react to above-threshold values by decreasing a pulse width T1, or to maintain pulse width T1 when values are near-threshold, but may not include information over a sufficiently long period of time to allow an increase in pulse width T1, which may cause higher temperatures and currents, for example. Accordingly, the N average adjustments may maintain a pulse width T1 or decrease pulse width T1. However, the N average adjustments do not include increasing the pulse width T1.

Operation 710 through operation 735 may repeated M times (operation 740), and the one or more controllers may store each of the average of the N stored temperatures, the average of the N stored di/dt's, and the average of the N stored filtered currents for each M cycle. For example, operation 710 through operation 735 may repeated 8 times, so that 8 average temperatures, 8 average di/dt's, and 8 average filtered currents are stored. After M cycles, the one or more controllers may determine an average of the M stored temperatures, an average of the M stored di/dt's, and an average of the M stored filtered currents (operation 745).

The one or more controllers may determine whether the average of the M stored temperatures is greater than a threshold temperature, whether the average of the M stored di/dt's is greater than a threshold di/dt, and whether the average of the M stored filtered currents is greater than a threshold filtered current (operation 750). If all of the average values are less than the corresponding thresholds, the one or more controllers may increase the pulse width T1 (operation 760). For example, the one or more controllers may increase the pulse width T1 from 140 ns to 150 ns. However, if any of the average values is greater than a corresponding threshold, which may indicate that a temperature or current is too high, the one or more controllers may decrease pulse width T1 (operation 755). For example, the one or more controllers may decrease the pulse width T1 from 140 ns to 130 ns. A time to complete the M cycles may be approximately 5 ms from a beginning of operation 710 to a beginning of operation 765, for example.

The one or more controllers may determine whether a voltage value of a bulk capacitor 810 (see FIG. 8) of the inverter 110 is less than a threshold discharge voltage value (operation 765). For example, the one or more controllers may perform an active discharge operation of bulk capacitor 810 to decrease the voltage value of bulk capacitor 810 from an initial voltage of 900V to less than a threshold discharge voltage value of 60V. In operation 765, when the one or more controllers determines that the voltage value of bulk capacitor 810 is less than the threshold discharge voltage value (e.g. 60V), then the voltage of bulk capacitor 810 may be considered to be less than a safe voltage value, and method 700 may end at operation 770. However, when the one or more controllers determines that the voltage value of bulk capacitor 810 is more than the threshold discharge voltage value (e.g. 60V), then the voltage of bulk capacitor 810 may be considered to be above a safe voltage value, and method 700 may return to operation 710 to repeat the active discharge operations.

Figure 8:
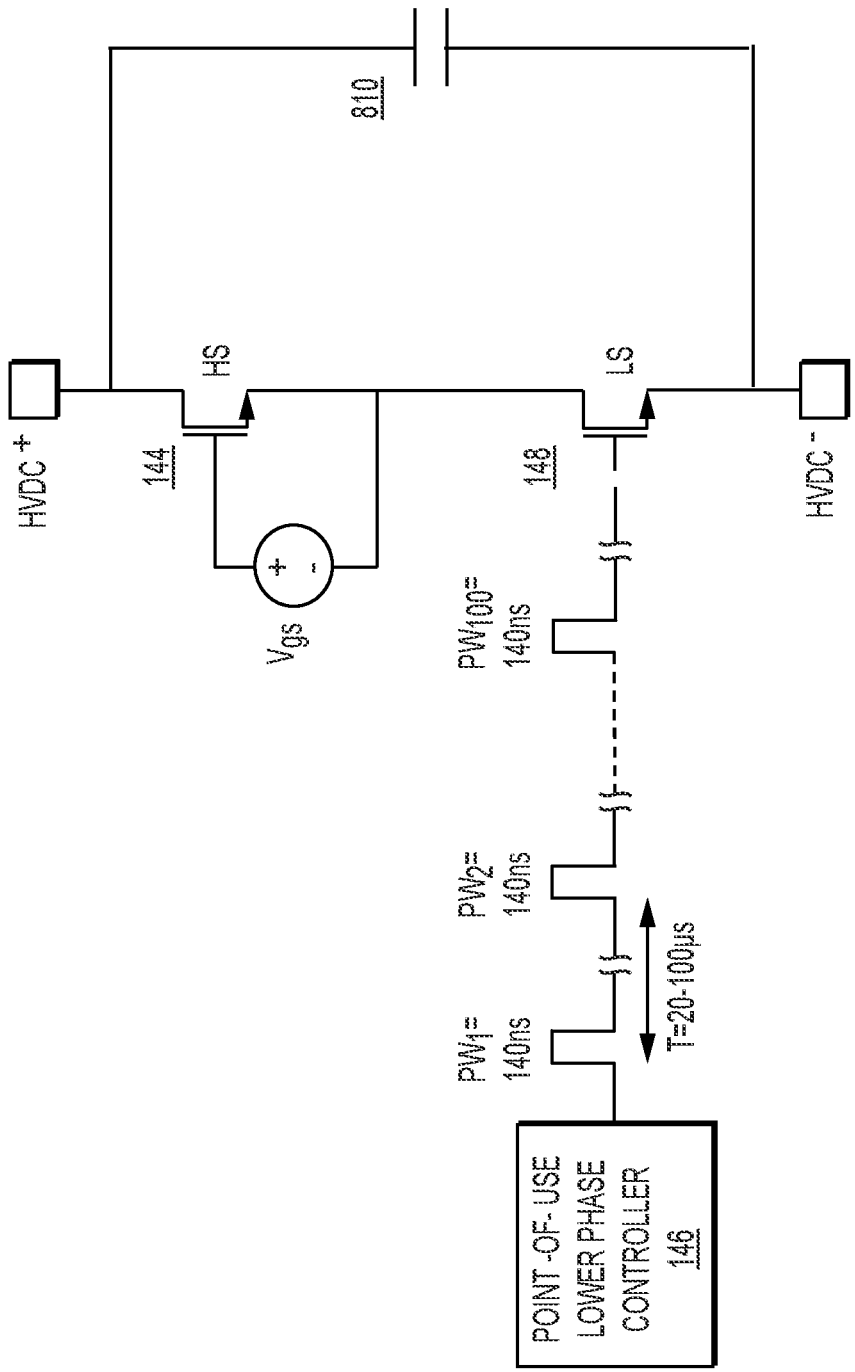
FIG. 8 depicts an exemplary system for controlling an active discharge operation, according to one or more embodiments.

FIG. 8 depicts an exemplary system for controlling an active discharge operation, according to one or more embodiments. As shown in FIG. 8, motor 190 and battery 195 may be disconnected from inverter 110 to isolate bulk capacitor 810. Bulk capacitor 810 may be a 1 mF capacitor, for example. HVDC may be 900V, for example. Upper phase switches 144 may be driven by a voltage source Vgs to at least partially, or fully, turn on upper phase switches 144 to pass current from the positive side of bulk capacitor 810 to lower phase switches 148. Point-of-use lower phase controller 146 may provide a gate control signal to lower phase switches 148 to control an operation of lower phase switches 148, and therefore a discharge operation of bulk capacitor 810.

Figure 9:
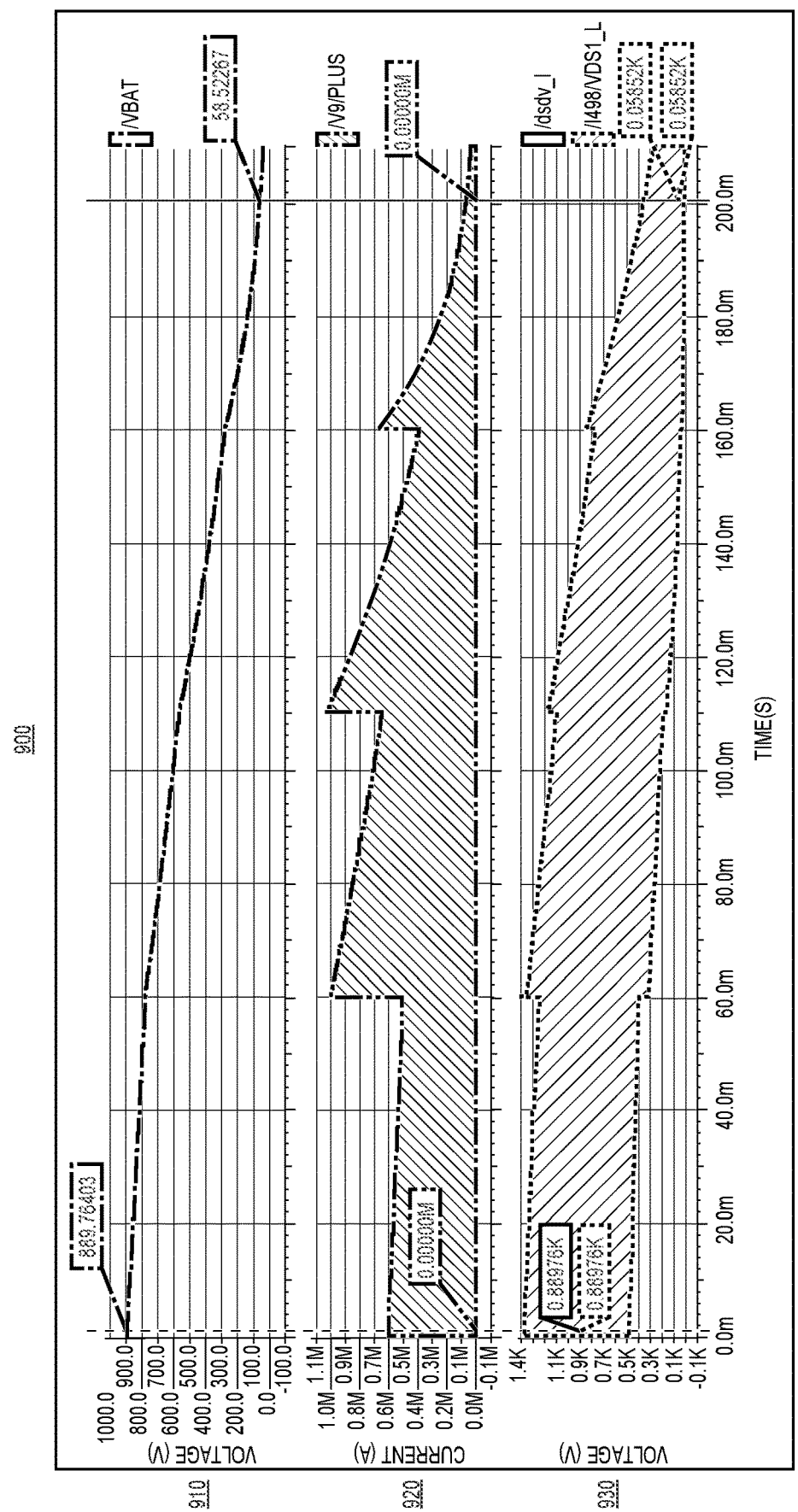
FIG. 9 depicts exemplary plots from controlling an active discharge operation, according to one or more embodiments.

FIG. 9 depicts exemplary plots 900 from controlling an active discharge operation, according to one or more embodiments. Plot 910 depicts the voltage of bulk capacitor 810 decreasing from approximately 900 V to approximately 60 V in approximately 200 ms. As shown in plot 910, after initiating the active discharge operation at time zero, the conditions have not become satisfied for a total time duration of 60 ms to begin increasing (or decreasing) T1 pulse width (see FIG. 7). A relatively constant slope decay of the bulk capacitor voltage along with the current decay (plot 920) flowing through the bulk capacitor are further evidence that the T1 stays constant for 60 ms. The shortest time window that the T1 pulse width may need to decrease is 40 ns or even less. At the times 60 ms, 110 ms, and 160 ms, the condition to increase T1 pulse width is satisfied, and by increasing T1 at these times, the average current flowing through the bulk capacitor increases accordingly, which increases the voltage decay across the bulk capacitor.

Plot 920 depicts a current flowing though bulk capacitor 810 which increases (due to an increase in pulse-width) with corresponding step changes at 60 ms, 110 ms, and 160 ms indicating that the pulse width T1 is increased (e.g. at operation 760). Immediately after the 60 ms, 110 ms, and 160 ms times, the bulk capacitor current and slope both decrease with time, which results in a voltage decay across the bulk capacitor. Plot 930 depicts the envelope (peak value) of the drain-to source voltage across lower phase switches 148, displaying a step rise in the envelope of the drain-to-source voltage at 60 ms, 110 ms, and 160 ms (correlating with the step changes at 60 ms, 110 ms, and 160 ms of plot 920). These drain-to-source voltages should be maintained below the voltage breakdown rating of the phase switches. As shown, the drain-to-source voltage decreases as the voltage across the bulk capacitor decays.

One or more embodiments may provide an active discharge of a 1 mF bulk capacitor from 900V to 60V with only one phase participating in the active discharge of less than 1000 ms for a switching frequency of 10 KHz. One or more embodiments may provide an active discharge of a 1 mF bulk capacitor from 900V to 60V with only one phase participating in the active discharge of less than 500 ms for a switching frequency of 20 KHz. One or more embodiments may provide an active discharge of a 1 mF bulk capacitor from 900V to 60V with only one phase participating in the active discharge of less than 200 ms for a switching frequency of 50 KHz.

One or more embodiments may provide an active discharge operation that continuously measures values of a temperature, a rate of change in current, and an average current, compares these measured values to associated threshold values, and periodically adjusts a pulse width of a PWM signal. One or more embodiments may provide a reduced time to discharge a bulk capacitor below a threshold voltage while maintaining a safe operation of the inverter.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
   an inverter configured to convert DC power from a battery to AC power to drive a motor, wherein the inverter includes:
   a power switch including a drain terminal, a source terminal, and a gate terminal; and
   one or more controllers configured to:
   detect a temperature of the power switch, a rate of change in current of the power switch, and a filtered current of the power switch,
   control a pulse width of a gate control signal to the gate terminal based on the detected temperature of the power switch, the detected rate of change in current of the power switch, and the detected filtered current of the power switch, and perform an N average determination, wherein the N average determination includes:

applying N pulses with a first pulse width and a period to the power switch, storing, during each period of the applied N pulses, the detected temperature of the power switch, the detected rate of change in current of the power switch, and the detected filtered current of the power switch, and determining an average of the N stored temperatures, an average of the N stored rates of change in current, and an average of the N stored filtered currents.

2. The system of claim 1, wherein the one or more controllers are further configured to perform an N threshold determination, wherein the N threshold determination includes:

determining whether the average of the N stored temperatures is greater than a threshold temperature, whether the average of the N stored rates of change in current is greater than a threshold rates of change in current, and whether the average of the N stored filtered currents is greater than a threshold filtered current, and controlling the pulse width of the gate control signal to the gate terminal based on the determining of the N threshold determination.

3. The system of claim 2, wherein the one or more controllers are further configured to perform an M average determination, wherein the M average determination includes:

repeating the N average determination and the N threshold determination for M cycles, storing the average of the N stored temperatures, the average of the N stored rates of change in current, and the average of the N stored filtered currents for each cycle of the M cycles, and determining an average of the M stored temperatures, an average of the M stored rates of change in current, and an average of the M stored filtered currents.

4. The system of claim 3, wherein the one or more controllers are further configured to perform an M threshold determination, wherein the M threshold determination includes:

determining whether the average of the M stored temperatures is greater than the threshold temperature, whether the average of the M stored rates of change in current is greater than the threshold rates of change in current, and whether the average of the M stored filtered currents is greater than the threshold filtered current, and controlling the pulse width of the gate control signal to the gate terminal based on the determining of the M threshold determination.

5. The system of claim 4, wherein the one or more controllers are further configured to:

determine a voltage value of a bulk capacitor of the inverter, and repeat the M average determination and the M threshold determination while the determined voltage value is greater than a threshold discharge voltage value.

6. The system of claim 2, wherein the controlling the pulse width of the gate control signal to the gate terminal based on the determining of the N threshold determination does not include increasing the pulse width.

7. The system of claim 1, wherein the one or more controllers are one or more point-of-use controllers on a power module with the power switch.

8. The system of claim 1, wherein the source terminal of the power switch is configured to be connected to a negative terminal of the battery, and the drain terminal of the power switch is configured to be connected to a phase terminal of the motor.

9. The system of claim 1, further comprising:

the battery configured to supply the DC power to the inverter; and the motor configured to receive the AC power from the inverter to drive the motor.

10. A method comprising:

detecting a temperature of a power switch, a rate of change in current of the power switch, and a filtered current of the power switch, controlling a pulse width of a gate control signal to a gate terminal of the power switch based on the detected temperature of the power switch, the detected rate of change in current of the power switch, and the detected filtered current of the power switch, and performing an N average determination, wherein the N average determination includes:

applying N pulses with a first pulse width and a period to the power switch, storing, during each period of the applied N pulses, the detected temperature of the power switch, the detected rate of change in current of the power switch, and the detected filtered current of the power switch, and determining an average of the N stored temperatures, an average of the N stored rates of change in current, and an average of the N stored filtered currents.

11. The method of claim 10, further comprising: performing an N threshold determination, wherein the N threshold determination includes:

determining whether the average of the N stored temperatures is greater than a threshold temperature, whether the average of the N stored rates of change in current is greater than a threshold rates of change in current, and whether the average of the N stored filtered currents is greater than a threshold filtered current, and controlling the pulse width of the gate control signal to the gate terminal based on the determining of the N threshold determination.

12. The method of claim 11, further comprising: performing an M average determination, wherein the M average determination includes:

repeating the N average determination and the N threshold determination for M cycles, storing the average of the N stored temperatures, the average of the N stored rates of change in current, and the average of the N stored filtered currents for each cycle of the M cycles, and determining an average of the M stored temperatures, an average of the M stored rates of change in current, and an average of the M stored filtered currents.

13. The method of claim 12, further comprising: performing an M threshold determination, wherein the M threshold determination includes:

determining whether the average of the M stored temperatures is greater than the threshold temperature, whether the average of the M stored rates of change in current is greater than the threshold rates of change in current, and whether the average of the M stored filtered currents is greater than the threshold filtered current, and controlling the pulse width of the gate control signal to the gate terminal based on the determining of the M threshold determination.

14. The method of claim 13, further comprising:

determining a voltage value of a bulk capacitor associated with the power switch, and repeating the M average determination and the M threshold determination while the determined voltage value is greater than a threshold discharge voltage value.

15. The method of claim 11, wherein the controlling the pulse width of the gate control signal to the gate terminal based on the determining of the N threshold determination does not include increasing the pulse width.

16. A system comprising:

a power module for an inverter for an electric vehicle, the power module comprising:

a power switch including a drain terminal, a source terminal, and a gate terminal; and one or more controllers configured to:

detect a temperature of the power switch, a rate of change in current of the power switch, and a filtered current of the power switch, control a pulse width of a gate control signal to the gate terminal based on the detected temperature of the power switch, the detected rate of change in current of the power switch, and the detected filtered current of the power switch, and perform an N average determination, wherein the N average determination includes:

applying N pulses with a first pulse width and a period to the power switch, storing, during each period of the applied N pulses, the detected temperature of the power switch, the detected rate of change in current of the power switch, and the detected filtered current of the power switch, and determining an average of the N stored temperatures, an average of the N stored rates of change in current, and an average of the N stored filtered currents.

17. The system of claim 16, wherein the one or more controllers are configured to control the pulse width of a gate control signal to the gate terminal by increasing or decreasing the pulse width.

18. The system of claim 17, wherein the one or more controllers are configured to perform an operation to decrease the pulse width more frequently than to perform an operation to increase the pulse width.

* * * * *